(12) United States Patent
Bourdelle et al.

(10) Patent No.: US 6,306,780 B1
(45) Date of Patent: Oct. 23, 2001

(54) METHOD FOR MAKING A PHOTORESIST LAYER HAVING INCREASED RESISTANCE TO BLISTERING, PEELING, LIFTING, OR RETICULATION

(75) Inventors: Konstantin K. Bourdelle; Pradip Kumar Roy, both of Orlando, FL (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/698,375

(22) Filed: Oct. 26, 2000

Related U.S. Application Data
(60) Provisional application No. 60/180,809, filed on Feb. 7, 2000.

(51) Int. Cl.$^7$ .................................................. H01L 21/324
(52) U.S. Cl. .............................................................. 438/798
(58) Field of Search ........................... 438/798, 795–797, 438/799, 800; 430/328, 326, 330

(56) References Cited

U.S. PATENT DOCUMENTS

| | | | |
|---|---|---|---|
| 4,882,263 | 11/1989 | Suzuki et al. | 430/328 |
| 5,356,758 | * 10/1994 | Orvek | 430/322 |

OTHER PUBLICATIONS
Hiraoka et al., UV hardening of photo–and electron beam resist patterns, J. Vac. Sci. Tech. 19(4), Nov./Dec. 1981, p. 1132–1135.

* cited by examiner

Primary Examiner—Charles Bowers
Assistant Examiner—Craig Thompson
(74) Attorney, Agent, or Firm—Allen, Dyer Doppelt Milbrath & Gilchrist, P.A.

(57) ABSTRACT

A method for making a photoresist layer includes forming a photoresist layer adjacent a substrate and patterning the photoresist layer. The photoresist layer may include at least one of a solvent and water. The photoresist layer may then be heated and exposed to ultraviolet light during the heating to reduce at least one of the solvent and water therein. As a result, the formation of gases in the photoresist layer during ion implantation is reduced, which thus reduces damage to the photoresist layer from blistering, peeling, lifting, or reticulation, for example. The photoresist layer may be formed to have a thickness greater than about 2 $\mu$m, for example, to block high-current, high-dosage, high-energy ion implantation. Exposing may include exposing the photoresist layer to ultraviolet light having a power density in a range of about 200 to 500 mW/cm$^2$, and, more preferably, about 270 to 360 mW/cm$^2$, and having a wavelength in a range of about 200 to 300 nm, for example. The photoresist layer may be heated for about 200 to 400 seconds and to a temperature in a range of about 150° C. to 250° C., and more preferably about 230° C. to 250° C. Furthermore, heating may include maintaining the photoresist layer at a high temperature for about 15 to 60 seconds.

45 Claims, 5 Drawing Sheets

METHOD FOR MAKING A PHOTORESIST LAYER HAVING INCREASED RESISTANCE TO BLISTERING, PEELING, LIFTING, OR RETICULATION

RELATED APPLICATION

The present application is based upon co-pending provisional application No. 60/180,809 filed Feb. 7, 2000, which is hereby incorporated herein in its entirety by reference.

FIELD OF THE INVENTION

The present invention relates to the field of semiconductor devices, and, more particularly, to the manufacture of semiconductor devices using photoresist materials.

BACKGROUND OF THE INVENTION

In the semiconductor device manufacturing process, masks are commonly used to define a pattern on a substrate or layer. For example, a mask may be formed using a material that is resistant to etchants so that the underlying substrate or layer is removed during etching where there are gaps in the mask. Alternatively, a mask may be made using a photoresist material that is impervious to radiation (such as ions used during ion implantation) to prevent the areas of the substrate or layer covered by the mask from being penetrated by the radiation.

One particular problem associated with typical photoresist layers used for ion implantation is that they are subject to degradation as a result of high-current, high-dosage, high-energy implants. That is, during implantation bonds within the polymer used to form the photoresist layer are broken, which leads to gases such as $H_2$, $H_2O$, $O_2$, and $N_2$ being released from the carbon chain and becoming trapped beneath carbonized photoresist material which is left behind. Stated alternatively, solvents and water present in the photoresist material may cause such gases to form under the carbonized photoresist material during the ion implantation. The formation of these gases results in bubbles which may cause blistering, peeling, lifting, and reticulation of the photoresist layer. Additionally, this problem may be particularly acute in thick photoresist layers, which are used for blocking high-current, high-dosage, high-energy ion implants, for example.

Typical methods for dealing with the above problem include performing an extended hardbake of the photoresist or using a hard mask instead of a photoresist layer. These methods may be disadvantageous because they require longer processing times and/or provide less desirable results than a photoresist layer. A method for enhancing heat resistance and plasma resistance of a photoresist layer is disclosed in U.S. Pat. No. 4,882,263 to Suzuki et al. entitled "Method for Treating Photoresists." The method involves applying ultraviolet rays to a developed photoresist layer at lower than 1 atmosphere of pressure while filtering unwanted radiation from the photoresist to prevent the generation of gases in the photoresist. Yet, to implement such filtering and processing at desired pressure levels may be cumbersome and require additional processing time.

Another prior art method for addressing image flow problems encountered in reactive ion etching processes is disclosed in an article by Hiraoka, H. et al. entitled "UV Hardening of Photo- and Electron Beam Resist Patterns," J. Vac. Sci. Technol., 19(4), November/December 1981, pp. 1132–1135. The article discloses the use of UV exposure or very low heating of resist patterns in air to render images resistant to image flow. Yet, the article fails to address how to alleviate the above-referenced gases to thereby reduce the occurrences of blistering, peeling, lifting, and reticulation.

SUMMARY OF THE INVENTION

In view of the foregoing background, it is therefore an object of the invention to provide a method for treating photoresist layers providing reduced blistering, peeling, lifting, or reticulation as a result of high-current, high-dosage, high-energy ion implantation.

This and other objects, features, and advantages in accordance with the present invention are provided by a method for making a photoresist layer including forming a photoresist layer adjacent a substrate and patterning the photoresist layer. The photoresist layer may include at least one of a solvent and water. The photoresist layer may then be heated and exposed to ultraviolet light during the heating to reduce at least one of the solvent and water therein. As a result, the formation of gases in the photoresist layer during ion implantation is reduced, which thus reduces damage to the photoresist layer from blistering, peeling, lifting, or reticulation, for example.

The photoresist layer may be formed to have a thickness greater than about 2 $\mu$m, for example, to block high-current, high-dosage, high-energy ion implantation. Exposing may include exposing the photoresist layer to ultraviolet light having a power density in a range of about 200 to 500 mW/cm$^2$, and, more preferably, about 270 to 360 mW/cm$^2$, and having a wavelength in a range of about 200 to 300 nm, for example. The photoresist layer may be heated for about 200 to 400 seconds and to a temperature in a range of about 150° C. to 250° C., and more preferably about 230° C. to 250° C. Furthermore, heating may include maintaining the photoresist layer at a high temperature for about 15 to 60 seconds.

The method may also include stabilizing the photoresist layer at a low temperature and exposing the photoresist layer to ultraviolet light during the stabilizing. The photoresist layer may be exposed to ultraviolet light during the stabilizing having a power density in a range of about 5 to 15 mW/cm$^2$ and having a wavelength in a range of about 200 to 300 nm, for example. Additionally, the stabilizing may be for about 15 to 60 seconds.

According to another aspect of the invention, a method for making a semiconductor device includes forming a photoresist layer adjacent a substrate, patterning the photoresist layer, and heating the photoresist layer. Furthermore, the method may also include exposing the photoresist layer to an ultraviolet light source during heating and exposing the photoresist layer to an ion source.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
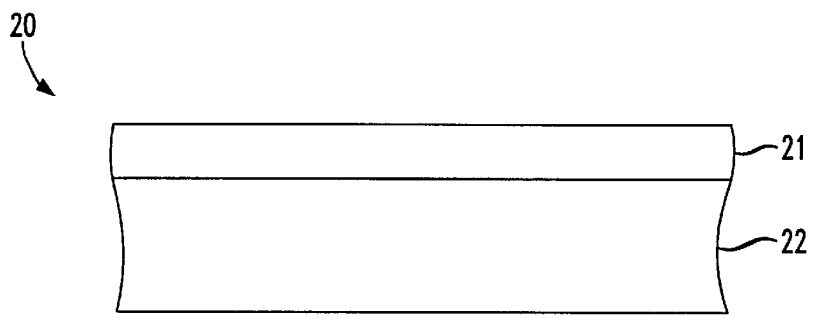
FIG. 1 is a cross-sectional view of a semiconductor substrate including a photoresist layer formed thereon in accordance with the present invention.
Figure 2:
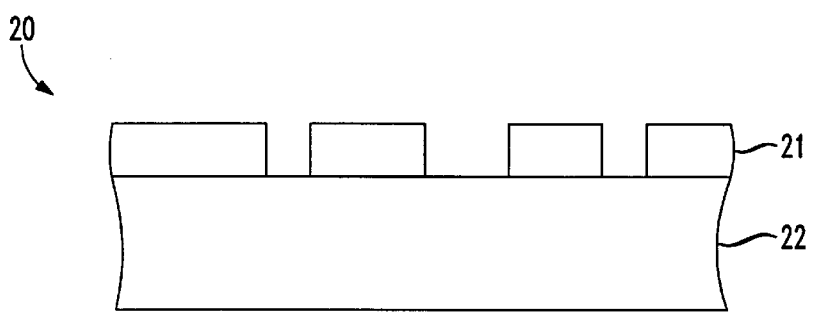
FIG. 2 is a cross-sectional view of the semiconductor substrate and photoresist layer of FIG. 1 after patterning of the photoresist layer according to the present invention.

Referring now to the cross-sectional view of a semiconductor device 20 shown in FIG. 1, a method for making a photoresist layer having increased resistance to damage caused by blistering, peeling, lifting, and reticulation, for example, as a result of high-current, high-energy, high-dose ion implantation according to one aspect of the invention is first described. The semiconductor device 20 includes a semiconductor substrate 22 and a photoresist layer 21 formed adjacent the semiconductor substrate. The photoresist layer 21 may be formed using conventional techniques known to those of skill in the art. The photoresist layer 21 may be of any thickness but is preferably greater than about 2 μm, for example, to block high-current, high-energy, high-dose ion implants. The semiconductor substrate 22 may include silicon, for example. Of course, those of skill in the art will appreciate that the present invention is not limited to any particular type of substrate material, and that the photoresist layer 21 may be formed adjacent other layers in a semiconductor device as well. The photoresist layer 21 may then be patterned (FIG. 2) using conventional techniques known in the art.

Figure 3:
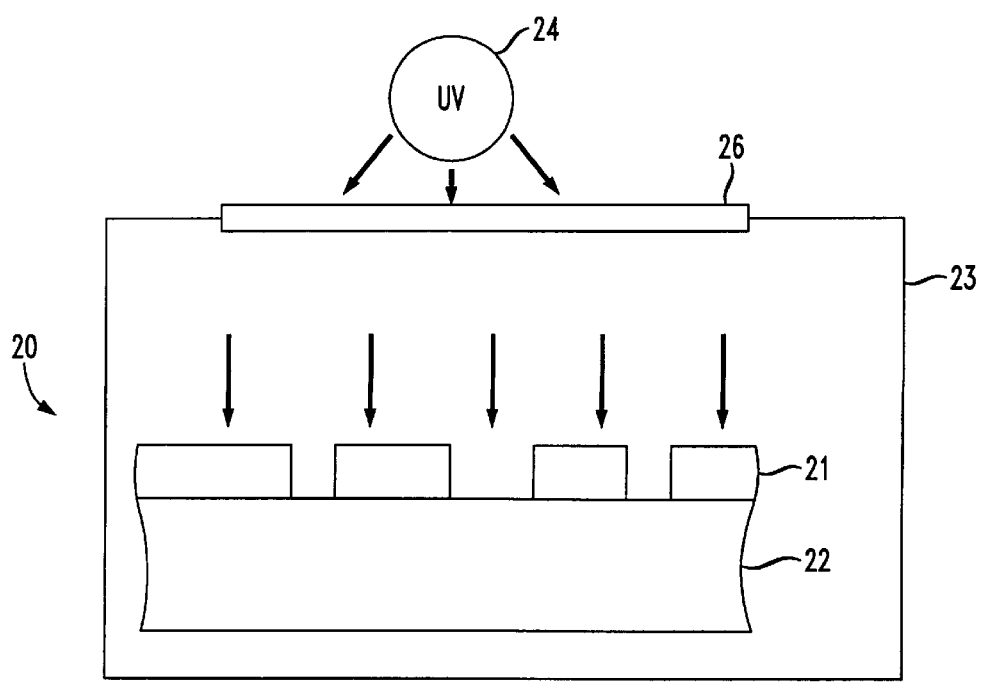
FIG. 3 is a cross-sectional view of the semiconductor substrate and patterned photoresist layer of FIG. 2 illustrating heating and UV exposure according to the present invention.

The photoresist layer 21 may then be heated using a heat source such as a furnace 23, for example, and exposed to an ultraviolet (UV) light source 24 during the heating through a window 26 in the furnace, as illustratively shown in FIG. 3. Alternatively, the heating and exposure may be performed using a hot plate coupled with a UV source. For example, a photoresist stabilization tool such as the Fusion Model 200 PCU by Axelis Technologies of Beverly, Mass., which includes both a hot plate and a UV source, may be used.

By exposing the photoresist layer 21 to the ultraviolet light source 24 during heating, the aforementioned solvents and water in the photoresist layer are thereby reduced and the photoresist pattern homogeneously cross-linked, as will be appreciated by those of skill in the art. Thus, the photoresist layer is less susceptible to blistering, peeling, lifting, and reticulation during the high-current, high-energy, high-dose ion implantation illustratively shown in FIG. 4, which will be described further below.

Figure 5:
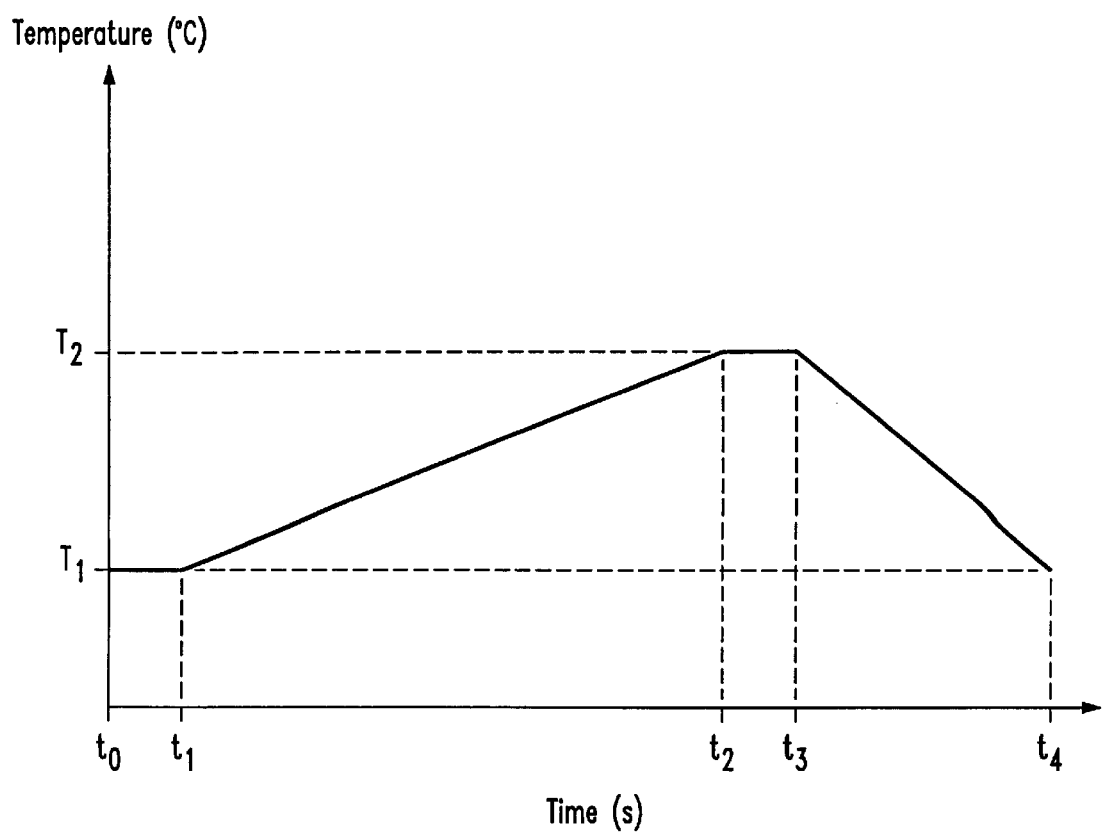
FIG. 5 is a graph of temperature versus time illustrating the heating and UV exposure according to the present invention.

Turning now to the graph of FIG. 5, the heating and UV exposure according to the present invention is now described. First, the photoresist layer 21 may be placed in a pre-heated environment (such as a furnace 23 or hot plate) at a low temperature $T_1$ of about 80° C. to 100° C., for example, at a time $t_0$. More preferably, the low temperature $T_1$ may be about 95° C. Next, the photoresist layer 21 may be stabilized at the temperature $T_1$ until a time $t_1$. The duration between times $t_0$ and $t_1$ may be about 15 to 60 seconds, for example, and more preferably about 30 seconds. The photoresist layer 21 may also be exposed to ultraviolet light during the stabilizing having a power density in a range of about 5 to 15 mW/cm$^2$ and a wavelength in a range of about 200 to 300 nm, for example. More preferably, the power density may be about 10 mW/cm$^2$ and the wavelength about 250 nm.

Following the stabilization, the photoresist layer 21 may be heated until is reaches a high temperature $T_2$ at time $t_2$. The high temperature $T_2$ is preferably in a range of about 150° C. to 250° C., and more preferably about 230° C. to 250° C. (e.g., 240° C.). The duration between times $t_1$ and $t_2$ is preferably about 200 to 400 seconds (e.g., 240 seconds) so that the temperature of the photoresist layer 21 is slowly ramped up. During this heating period, the photoresist layer 21 may be exposed to ultraviolet light having a power density in a range of about 200 to 500 mW/cm$^2$ (e.g., about 270 to 360 mW/cm$^2$) and a wavelength in a range of about 200 to 300 nm, for example. Particularly, the power density may preferably be about 330 mW/cm$^2$ and the wavelength may be about 250 nm.

Once the photoresist layer 21 reaches the temperature $T_2$, this temperature may be maintained until a time $t_3$, which may be about 15 to 60 seconds and, more preferably, about 30 seconds. During this time, the UV exposure may be continued at the aforementioned power density and wavelength used during the heating or ramping up to the high temperature $T_2$, noted above. Thereafter, the UV exposure may be stopped and the photoresist layer 21 allowed to return to the low temperature $T_1$ at a time $t_4$.

Figure 4:
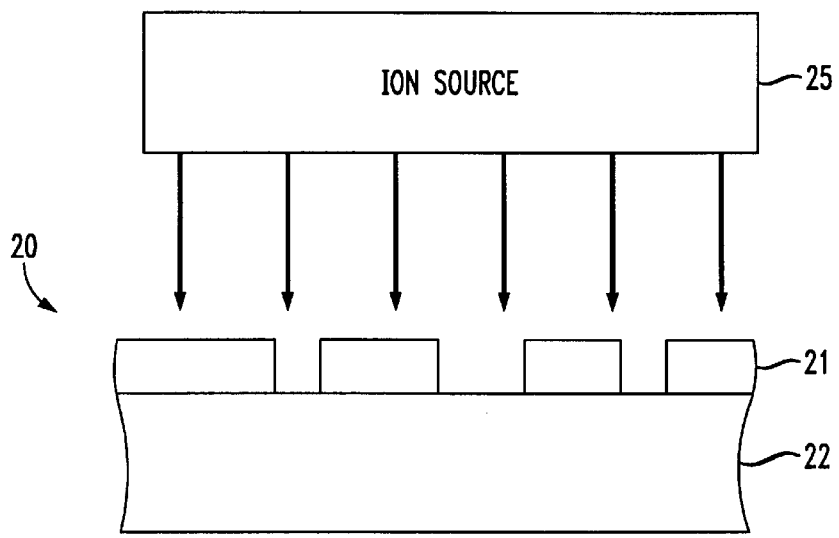
FIG. 4 is a cross-sectional view of the semiconductor substrate and photoresist layer of FIG. 3 illustrating ion implantation in the semiconductor substrate through the photoresist layer.

The photoresist layer 21 may then be exposed to an ion source 25 to provide the high-current, high-energy, high-dose ion implantation in the semiconductor substrate 22 (FIG. 4). That is, the ion source preferably provides a current of greater than about 0.3 mA, a dosage of greater than about $5 \times 10^{14}$ cm$^{-2}$, or an energy level of greater than about 0.5 MeV, for example. The treated photoresist layer 21 blocks the ion implantation in predefined areas of the semiconductor substrate 22. The ion source 25 may be a phosphorus ion source or an arsenic ion source, for example. The photoresist layer 21 may be removed after the ion implantation, again using conventional techniques known to those of skill in the art.

Figure 6:
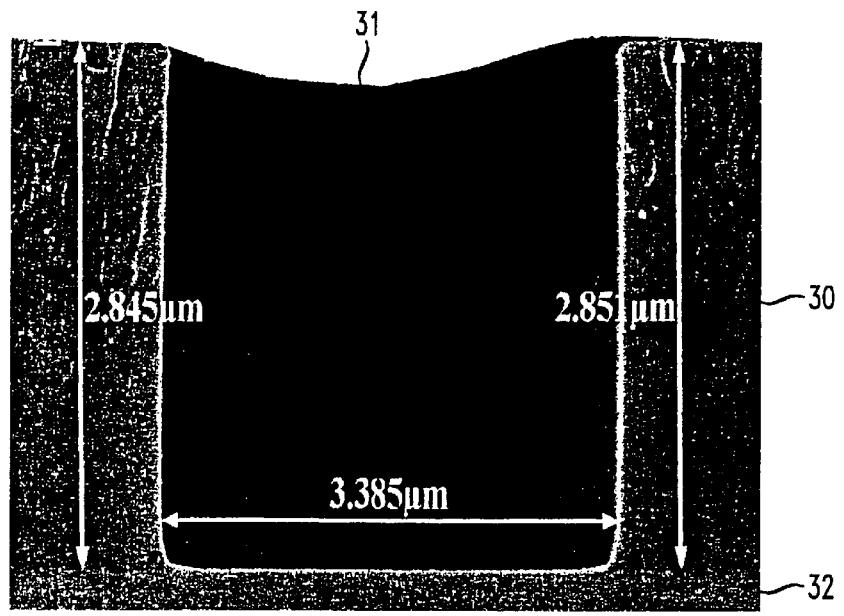
FIGS. 6 and 7 are scanning electron microscope (SEM) cross-sectional images of a photoresist layer before and after heating and UV exposure according to the present invention.

Cross-sectional scanning electron microscope (SEM) images of a patterned photoresist layer 30 before and after the heating and UV exposure described above are shown in FIGS. 6 and 7, respectively. The photoresist layer 30 defines a trench 31 therein having a width of 3.385 μm, and the photoresist layer is formed on a silicon substrate 32. Prior to the heating and UV exposure, the photoresist layer 30 has a thickness of 2.845 μm on a left side of the trench 31 and a thickness of 2.851 μm on a right side of the trench, as seen in FIG. 6.

Figure 7:
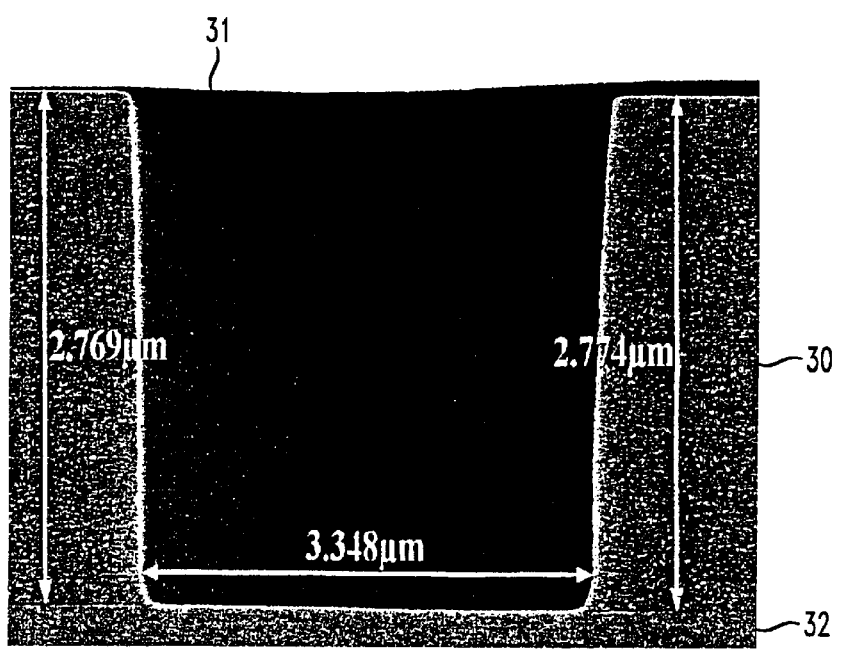

After the heating and UV exposure, the width of the trench 31 has shrunk slightly to 3.348 μm, as seen in FIG. 7. The thicknesses of the left and right sides of the trench 31 have also shrunk slightly to 2.769 μm and 2.774 μm, respectively. The shrinking is due to the removal of the aforementioned solvents and water from the photoresist layer 30 and the resulting homogeneous cross-linking of the photoresist layer. The ability of the photoresist layer 30 to block the ion implantation is substantially unaffected by this slight shrinkage, yet the photoresist layer is much more resistant to damage caused by blistering, peeling, lifting, or reticulation as a result of the ion implantation, as described further below.

EXAMPLE

Figure 8:
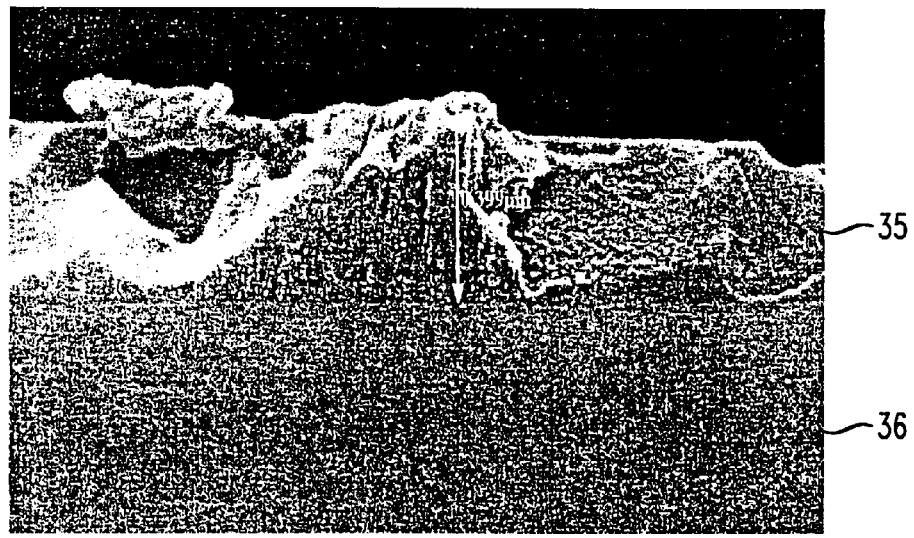
FIGS. 8 and 9 are SEM cross-sectional images of an untreated prior art photoresist layer showing damage thereof from ion implantation.
Figure 9:
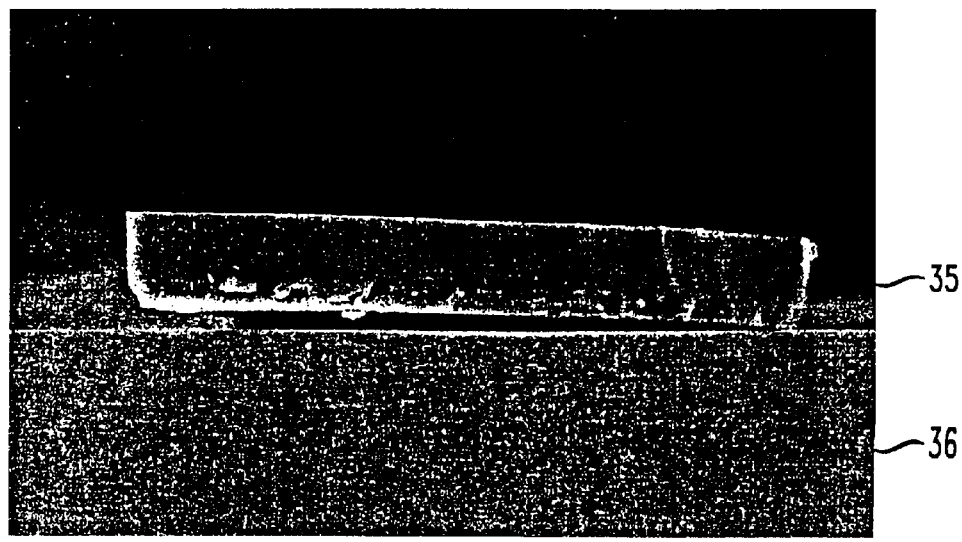

The effects of a high-current, high-energy, high-dose ion implantation on a prior art photoresist layer which has not been treated according to the method of the present invention will now be described. Specifically, a 3 $\mu$m thick positive Shipley photoresist layer 35 was formed on a silicon substrate 36 and then subjected to a 1 MeV positive implant with a dosage greater than about $5\times10^{14}$ cm$^{-2}$. SEM images showing the resulting damage to the photoresist layer 35 from the ion implantation are shown in FIGS. 8 and 9.

Figure 10:
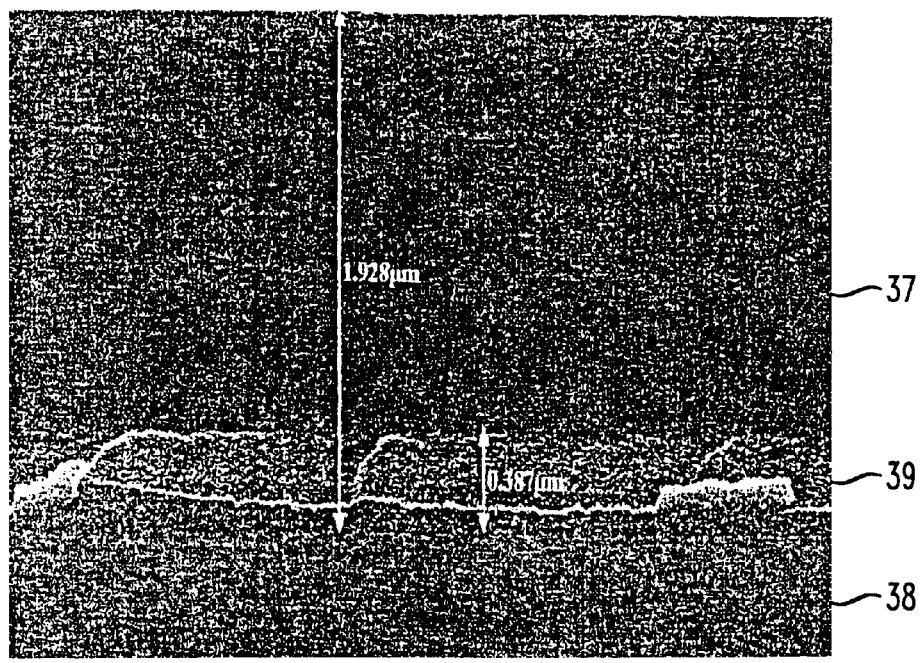
FIGS. 10 and 11 are SEM cross-sectional views of photoresist layers treated according to the present invention after ion implantation.

In contrast, an identical photoresist layer 37 formed on a silicon substrate 38 was treated according to the above-described method of the present invention and then subjected to the same implantation dosage and energy level described above. An SEM image of the resulting photoresist layer 37 is shown in FIG. 10. Some shrinkage of the photoresist layer 37 was observed (i.e., down to a thickness of 1.928 $\mu$m), along with an area of carbonization 39 at the bottom of the photoresist layer. However, it can be seen that substantially no blistering, peeling, lifting, or reticulation is evident in the photoresist layer 37.

Figure 11:
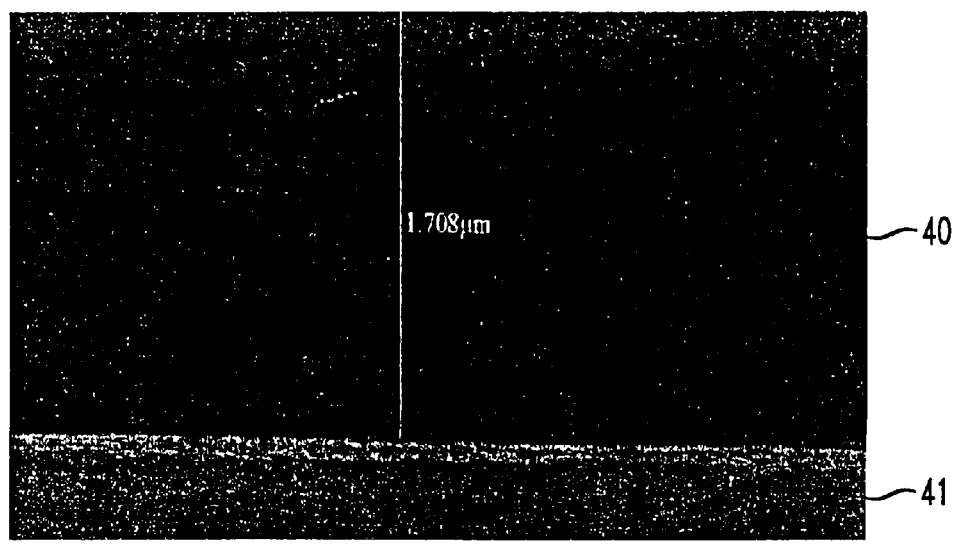

The same test was also run on another similarly treated photoresist layer 40 formed on a silicon substrate 41 under the same conditions with the exception that the energy level of the ion implant was increased 1.1 MeV. The results of this test are shown in the SEM image of FIG. 11. The higher energy level resulted in further shrinkage of the photoresist layer, i.e., to a thickness of 1.708 $\mu$m. Here again, the increased resistance to damage caused by blistering, peeling, lifting, or reticulation is clearly evident.

Accordingly, the present invention provides a method for producing a thick photoresist layer for blocking high-energy, high-dose, and high-current ion implantation and that is also less susceptible to damage caused by blistering, peeling, lifting, or reticulation, for example. One example of an application in which such photoresist layers may be particularly advantageous is in the formation of sub-collector regions of bipolar transistors. Bipolar complementary metal-oxide semiconductor (BiCMOS) technology exhibiting excellent performance may therefore be manufactured in a typical CMOS production line without any dedicated equipment, as will be appreciated by those of skill in the art.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that other modifications and embodiments are intended to be included within the scope of the appended claims.

That which is claimed is:

1. A method for making a photoresist layer having increased resistance to damage from ion implantation, the method comprising:

forming a photoresist layer adjacent a substrate, the photoresist layer comprising at least one of a solvent and water;

patterning the photoresist layer;

heating the photoresist layer; and exposing the photoresist layer to ultraviolet light during heating to reduce at least one of the solvent and water therein to thereby reduce formation of gases in the photoresist layer during ion implantation.

2. The method of claim 1 wherein forming the photoresist layer comprises forming the photoresist layer to have a thickness greater than about 2 $\mu$m.

3. The method of claim 1 wherein exposing comprises exposing the photoresist layer to ultraviolet light having a power density in a range of about 200 to 500 mW/cm$^2$.

4. The method of claim 3 wherein exposing comprises exposing the photoresist layer to ultraviolet light having a power density in a range of about 270 to 360 mW/cm$^2$.

5. The method of claim 1 wherein heating comprises heating the photoresist layer for about 200 to 400 seconds.

6. The method of claim 1 wherein heating comprises maintaining the photoresist layer at a high temperature for about 15 to 60 seconds.

7. The method of claim 1 wherein exposing comprises exposing the photoresist layer to ultraviolet light having a wavelength in a range of about 200 to 300 nm.

8. The method of claim 1 wherein heating comprises heating to a temperature in a range of about 150° C. to 250° C.

9. The method of claim 8 wherein heating comprises heating to a temperature in a range of about 230° C. to 250° C.

10. The method of claim 1 further comprising stabilizing the photoresist layer at a low temperature and exposing the photoresist layer to ultraviolet light during the stabilizing.

11. The method of claim 10 wherein exposing the photoresist layer to ultraviolet light during the stabilizing comprises exposing the photoresist layer to ultraviolet light having a power density in a range of about 5 to 15 mW/cm$^2$.

12. The method of claim 10 wherein exposing the photoresist layer to ultraviolet light during the stabilizing comprises exposing the photoresist layer to ultraviolet light having a wavelength in a range of about 200 to 300 nm.

13. The method of claim 10 wherein stabilizing comprises stabilizing for about 15 to 60 seconds.

14. The method of claim 1 wherein the substrate comprises silicon.

15. A method for making a photoresist layer comprising:

forming a photoresist layer having a thickness greater than about 2 $\mu$m adjacent a substrate;

patterning the photoresist layer;

heating the photoresist layer; and exposing the photoresist layer to ultraviolet light during heating.

16. The method of claim 15 wherein exposing comprises exposing the photoresist layer to ultraviolet light having a power density in a range of about 200 to 500 mW/cm$^2$.

17. The method of claim 16 wherein exposing comprises exposing the photoresist layer to ultraviolet light having a power density in a range of about 270 to 360 mW/cm$^2$.

18. The method of claim 15 wherein heating comprises heating the photoresist layer for about 200 to 400 seconds.

19. The method of claim 15 wherein heating comprises maintaining the photoresist layer at a high temperature for about 15 to 60 seconds.

20. The method of claim 15 wherein exposing comprises exposing the photoresist layer to ultraviolet light having a wavelength in a range of about 200 to 300 nm.

21. The method of claim 15 wherein heating comprises heating to a temperature in a range of about 150° C. to 250° C.

22. The method of claim 21 wherein heating comprises heating to a temperature in a range of about 230° C. to 250° C.

23. The method of claim 15 further comprising stabilizing the photoresist layer at a low temperature and exposing the photoresist layer to ultraviolet light during the stabilizing.

24. The method of claim 23 wherein exposing the photoresist layer to ultraviolet light during the stabilizing comprises exposing the photoresist layer to ultraviolet light having a power density in a range of about 5 to 15 mW/cm$^2$.

25. The method of claim 23 wherein exposing the photoresist layer to ultraviolet light during the stabilizing comprises exposing the photoresist layer to ultraviolet light having a wavelength in a range of about 200 to 300 nm.

26. The method of claim 23 wherein stabilizing comprises stabilizing for about 15 to 60 seconds.

27. The method of claim 15 wherein the substrate comprises silicon.

28. A method for making a semiconductor device comprising:

forming a photoresist layer adjacent a substrate;

patterning the photoresist layer;

heating the photoresist layer;

exposing the photoresist layer to ultraviolet light during heating; and exposing the photoresist layer to an ion source.

29. The method of claim 28 wherein forming the photoresist layer comprises forming the photoresist layer to have a thickness greater than about 2 μm.

30. The method of claim 28 wherein exposing comprises exposing the photoresist layer to ultraviolet light having a power density in a range of about 200 to 500 mW/cm$^2$.

31. The method of claim 30 wherein exposing comprises exposing the photoresist layer to ultraviolet light having a power density in a range of about 270 to 360 mW/cm$^2$.

32. The method of claim 28 wherein heating comprises heating the photoresist layer for about 200 to 400 seconds.

33. The method of claim 28 wherein heating comprises maintaining the photoresist layer at a high temperature for about 15 to 60 seconds.

34. The method of claim 28 wherein exposing comprises exposing the photoresist layer to ultraviolet light having a wavelength in a range of about 200 to 300 nm.

35. The method of claim 28 wherein heating comprises heating to a temperature in a range of about 150° C. to 250° C.

36. The method of claim 35 wherein heating comprises heating to a temperature in a range of about 230° C. to 250° C.

37. The method of claim 28 further comprising stabilizing the photoresist layer at a low temperature and exposing the photoresist layer to ultraviolet light during the stabilizing.

38. The method of claim 37 wherein exposing the photoresist layer to ultraviolet light during the stabilizing comprises exposing the photoresist layer to ultraviolet light having a power density in a range of about 5 to 15 mW/cm$^2$.

39. The method of claim 37 wherein exposing the photoresist layer to ultraviolet light during the stabilizing comprises exposing the photoresist layer to ultraviolet light having a wavelength in a range of about 200 to 300 nm.

40. The method of claim 37 wherein stabilizing comprises stabilizing for about 15 to 60 seconds.

41. The method of claim 28 wherein exposing the photoresist layer to the ion source comprises exposing the photoresist layer to an ion source providing a current of greater than about 0.3 mA.

42. The method of claim 28 wherein exposing the photoresist layer to the ion source comprises exposing the photoresist layer to an ion source providing a dosage of greater than about $5 \times 10^{14}$ cm$^{-2}$.

43. The method of claim 28 wherein exposing the photoresist layer to the ion source comprises exposing the photoresist layer to an ion source providing an energy level of greater than about 0.5 MeV.

44. The method of claim 28 wherein exposing the photoresist layer to the ion source comprises exposing the photoresist layer to a phosphorus ion source.

45. The method of claim 28 wherein exposing the photoresist layer to the ion source comprises exposing the photoresist layer to an arsenic ion source.

* * * * *